United States Patent
Oh et al.

(10) Patent No.: US 11,372,591 B2
(45) Date of Patent: Jun. 28, 2022

(54) MEMORY APPARATUS, A SEMICONDUCTOR SYSTEM INCLUDING THE SAME AND AN OPERATING METHOD THEREOF

(71) Applicant: SK hynix Inc., Icheon-si (KR)

(72) Inventors: Seung Wook Oh, Icheon-si (KR); Chang Hyun Kim, Icheon-si (KR); Young Jae An, Icheon-si (KR); Woong Rae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/157,516

(22) Filed: Jan. 25, 2021

(65) Prior Publication Data

US 2021/0405927 A1    Dec. 30, 2021

Related U.S. Application Data

(60) Provisional application No. 63/046,095, filed on Jun. 30, 2020.

(30) Foreign Application Priority Data

Nov. 10, 2020    (KR) .................. 10-2020-0149060

(51) Int. Cl.
*G11C 7/00* (2006.01)
*G06F 3/06* (2006.01)
*G11C 7/10* (2006.01)
*G11C 7/20* (2006.01)
*G11C 8/10* (2006.01)

(52) U.S. Cl.
CPC .......... *G06F 3/0659* (2013.01); *G06F 3/0604* (2013.01); *G06F 3/0673* (2013.01); *G11C 7/106* (2013.01); *G11C 7/1066* (2013.01); *G11C 7/1069* (2013.01); *G11C 7/1096* (2013.01);
(Continued)

(58) Field of Classification Search
CPC ... G11C 11/4076; G11C 11/4093; G11C 5/04; G11C 7/1045; G11C 5/00; G11C 7/10; G11C 7/222; G11C 8/06; G11C 8/10; G11C 11/4087; G11C 7/22; G11C 8/18; G11C 11/408; G11C 11/4096; G11C 7/1039; G11C 11/4085; G11C 11/4091; G11C 7/1066; G11C 7/1072; G11C 5/06; G11C 11/005; G11C 16/32; G11C 29/16; G11C 29/36; G11C 8/00; G11C 8/12; G06F 13/4086; G06F 13/1668
USPC .. 365/230.06, 189.12, 63, 198, 191, 230.03, 365/189.011, 233.1, 185.08, 189.03, 365/189.14, 201, 233.11, 236, 189.04, 365/189.05, 194, 230.01, 233.13; 711/105, 167, 154, 104, 213, 5, E12.083,
(Continued)

(56) References Cited

U.S. PATENT DOCUMENTS 5,982,694 A * 11/1999 Vogley ................ G11C 7/1018
365/233.13

* cited by examiner

*Primary Examiner* — Thong Q Le
(74) *Attorney, Agent, or Firm* — William Park & Associates Ltd.

(57) ABSTRACT

A semiconductor system includes a memory controller and a memory apparatus. The memory controller provides at least first to third command address signals. The memory apparatus performs a burst read operation based on the first and second command address signals, and terminates the burst read operation by receiving the third command address signal twice. The memory apparatus continuously initializes (Continued)

an internal circuit that is performing the burst read operation in a section the third command address signal is received twice.

25 Claims, 12 Drawing Sheets

(52) U.S. Cl.
CPC ................. *G11C 7/20* (2013.01); *G11C 8/10* (2013.01); *G11C 2207/2272* (2013.01)
(58) Field of Classification Search
USPC ....... 711/169, 218, 106, 118, 137, 156, 158, 711/170, 217
See application file for complete search history.

MEMORY APPARATUS, A SEMICONDUCTOR SYSTEM INCLUDING THE SAME AND AN OPERATING METHOD THEREOF

CROSS-REFERENCES TO RELATED APPLICATION

The present application claims priority under 35 U.S.C. § 119(a) to U.S. provisional application No. 63/046,095, filed on Jun. 30, 2020, and Korean application number 10-2020-0149060, filed on Nov. 10, 2020, in the Korean Intellectual Property Office, which is incorporated herein by reference in its entirety as set forth in full.

BACKGROUND

1. Technical Field

Various embodiments generally relate to an integrated circuit technology, and, more particularly, to a memory apparatus, a semiconductor system including the same and an operating method thereof.

2. Related Art

An electronic device includes a lot of electronic elements and a computer system, as the electronic device, includes lots of semiconductor apparatuses each configured by a semiconductor. The semiconductor apparatuses that configure the computer system may communicate with each other by transmitting and receiving a clock signal and data. Each of the semiconductor apparatuses may operate in synchronization with a clock signal. The computer system may be configured by various semiconductor systems. A memory apparatus to be coupled to a processor or a memory controller is a classic element within the semiconductor system. Before performing a normal operation, the memory controller and the memory apparatus may perform a training operation to adjust various parameters for data communication. A memory apparatus may be provided with a mode register set and may perform a training operation by utilizing the mode register set. During a particular training operation, a memory apparatus may periodically generate an internal command signal even without receiving a command from a memory controller and may periodically provide the memory controller with data based on the internal command signal. Such operation is referred to as a mode register burst read operation.

SUMMARY

In an embodiment, a semiconductor system may include a memory controller and a memory apparatus. The memory controller may be configured to provide at least a first command address signal, a second command address signal, and a third command address signal. The memory apparatus may be configured to perform a burst read operation based on the first command address signal and the second command address signal, configured to terminate the burst read operation when the third command address signal is first received while the burst read operation is being performed, and configured to continuously initialize an internal circuit that is performing the burst read operation at least in a time period from when the third command address signal is first received until the third command address signal is secondly received.

In an embodiment, a semiconductor system may include a memory apparatus and a memory controller. The memory controller may be configured to sequentially provide a first command address signal and a second command address signal to control the memory apparatus to perform a burst read operation and configured to provide, at least twice, a third command address signal to control the memory apparatus to terminate the burst read operation. The memory apparatus may be configured to enable a reset signal to initialize an internal circuit that is performing the burst read operation based on the first received third command address signal and configured to disable the reset signal based on the secondly received third command address signal.

In an embodiment, an operating method of a semiconductor system may include performing, by a memory apparatus, a burst read operation by sequentially receiving a first command address signal and a second command address signal from a memory controller. The operating method may include terminating, by the memory apparatus, the burst read operation and starting, by the memory apparatus, an operation of initializing an internal circuit that is performing the burst read operation, by receiving a third command address signal from the memory controller. The operating method may include terminating, by the memory apparatus, the operation of initializing the internal circuit that is performing the burst read operation by receiving another third command address signal from the memory controller.

In an embodiment, a semiconductor memory apparatus may include a command address receiving circuit, a command decoder, a delay circuit, a data input/output circuit, and a mode register set. The command address receiving circuit may be configured to receive a command address signal. The command decoder may be configured to generate an internal read signal and an internal write pulse based on the command address signal and configured to generate the internal read signal based on a burst read signal. The delay circuit may be configured to delay the internal read signal and a clock signal to generate a delay command signal and a delay clock signal. The data input/output circuit may be configured to output data based on the delay command signal and the delay clock signal and configured to be initialized based on a reset signal. The mode register set may be configured to generate a burst read enable signal based on the command address signal, configured to generate the burst read signal based on the burst read enable signal and configured to generate the reset signal based on the burst read enable signal and the internal write pulse.

In an embodiment, a semiconductor system may include a memory controller and a memory apparatus. The memory controller may be configured to provide at least a first command address signal, a second command address signal, and a third command address signal. The memory apparatus may be configured to perform a burst read operation based on the first command address signal and the second command address signal, configured to terminate the burst read operation when the third command address signal is received twice, and configured to continuously initialize an internal circuit that is performing the burst read operation in a section the third command address signal is received twice.

DETAILED DESCRIPTION

Hereinafter, embodiments will be described in detail with reference to the accompanying drawings.

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
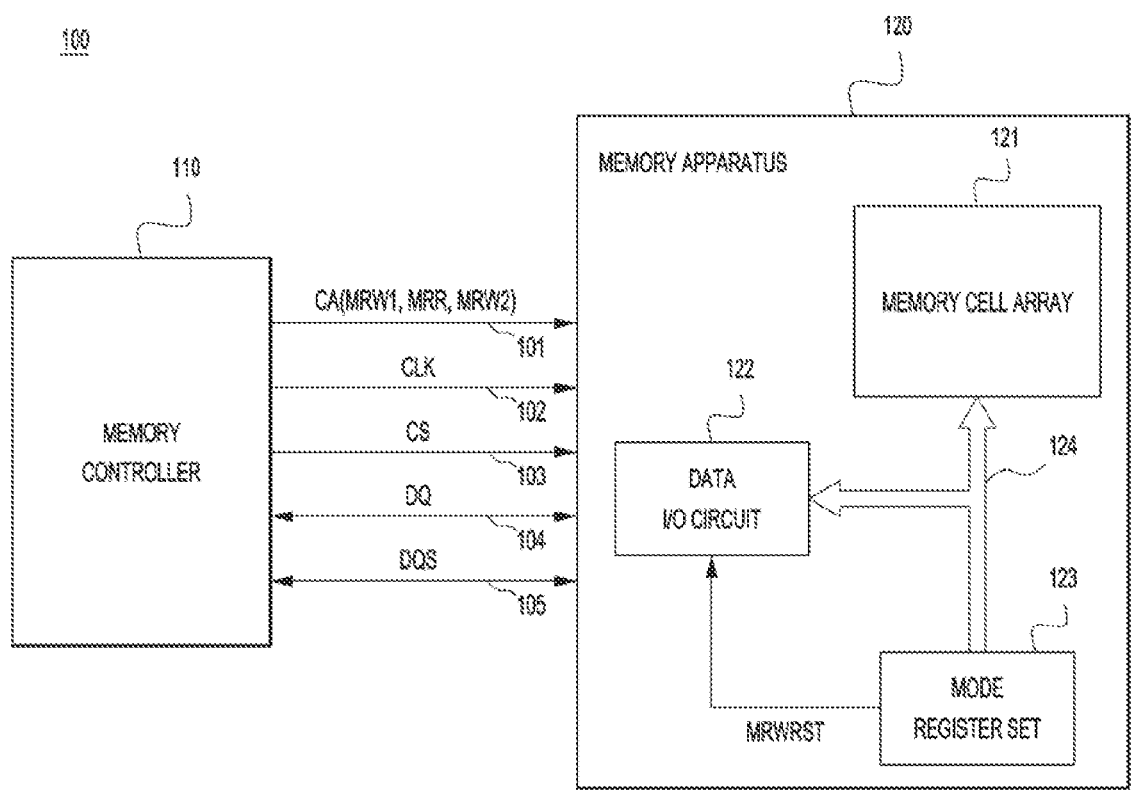
FIG. 1 is a diagram illustrating a configuration of a semiconductor system in accordance with an embodiment.

FIG. 1 is a diagram illustrating a configuration of a semiconductor system 100 in accordance with an embodiment. Referring to FIG. 1, the semiconductor system 100 may include a memory controller 110 and a memory apparatus 120. The memory controller 110 may be a host device configured to provide various control signals required for the memory apparatus 120 to operate. The memory apparatus 120 may be a slave device configured to perform various operations under the control of the memory controller 110. The memory apparatus 120 may be coupled to the memory controller 110 through a plurality of buses. The plurality of buses may include a signal transmission path, a link, or a channel for transmission of a signal. The plurality of buses may include a command address bus 101, a clock bus 102, a chip select bus 103, a data bus 104, a data strobe bus 105, and so forth. Each of the command address bus 101, the clock bus 102 and the chip select bus 103 may be a unidirectional bus and each of the data bus 104 and the data strobe bus 105 may be a bidirectional bus. The memory apparatus 120 may receive a command address signal CA through the command address bus 101. The command address signal CA may include a plurality of bits. The memory apparatus 120 may receive a system clock signal CLK through the clock bus 102. The system clock signal CLK may be provided as a single-ended signal and may be provided, as a differential signal, together with a complementary signal. The command address signal CA may be transmitted from the memory controller 110 to the memory apparatus 120 in synchronization with the system clock signal CLK. The memory apparatus 120 may receive a chip select signal CS from the memory controller 110 through the chip select bus 103. The chip select signal CS may be transmitted in synchronization with the command address signal CA. The chip select signal CS may be utilized as a signal that confirms the validity of the command address signal CA. For example, the memory apparatus 120 may determine the command address signal CA as valid and may perform various operations based on the command address signal CA when the memory apparatus 120 receives the chip select signal CS, which is enabled, together with the command address signal CA. Through the data bus 104, the memory apparatus 120 may receive data DQ from the memory controller 110 and may provide data DQ to the memory controller 110. Through the data strobe bus 105, the memory apparatus 120 may receive a data strobe signal DQS from the memory controller 110 and may provide a data strobe signal DQS to the memory controller 110. The data strobe signal DQS may be a clock signal that toggles while the data DQ is being transmitted. The data DQ and the data strobe signal DQS may be synchronized with each other.

The memory apparatus 120 may include a memory cell array 121, a data input/output (I/O) circuit 122, and a mode register set 123. The memory cell array 121 may include a plurality of memory cells and may store data that is transmitted from the memory controller 110. The data I/O circuit 122 may receive and transmit the data DQ between the memory controller 110 and the memory apparatus 120. During a read operation, the data I/O circuit 122 may read data that is stored in the memory cell array 121 and may provide the memory controller 110 with the read data as the data DQ. During a write operation, the data I/O circuit 122 may receive the data DQ that is provided from the memory controller 110 and may store the received data DQ into the memory cell array 121. The memory cell array 121 and the data I/O circuit 122 may be coupled to each other through a data transmission line 124. Data may be transferred between the memory cell array 121 and the data I/O circuit 122 through the data transmission line 124. During the read operation, the data I/O circuit 122 may provide the memory controller 110 with the data DQ, together with the data strobe signal DQS, which is a clock signal in synchronization with the data DQ. During the write operation, the data I/O circuit 122 may receive the data DQ and the data strobe signal DQS, which are provided from the memory controller 110.

The mode register set 123 may store various information that is related to operations of the memory apparatus 120. For example, the mode register set 123 may store information regarding setting the Burst Length, the Burst Chop, the Operation mode, the Latency and so forth. The information will not be limited thereto. The information regarding the Burst Length and the Burst Chop may be related to the bandwidth of the data DQ that is to be provided to or from the memory apparatus 120. The information regarding the Operation mode may include information related to a training operation and a test operation that the memory apparatus 120 performs. The information regarding the Operation mode may also include information regarding enabling and disabling a delay locked loop circuit included in the memory apparatus 120 and information regarding setting an on-resistance value of the data I/O circuit 122. The Latency may include the Column-Address-Strobe (CAS) Latency, the Read Latency, the Write Latency, the Additive Latency and so forth. These latencies may represent the amount of delay time for the memory apparatus 120 to perform an operation that corresponds to the command address signal CA after the memory apparatus 120 receives the command address signal CA from the memory controller 110. The mode register set 123 may store various data based on the command address signal CA that is provided from the memory controller 110. In the disclosure, the mode register data may be the various data that is already stored or to be stored in the mode register set 123. The mode register set 123 may store therein the mode register data based on the command address signal CA. The mode register set 123 may control the memory apparatus 120 to output the mode register data that is stored in the mode register set 123 or output an arbitrary data pattern based on the command address signal CA. The arbitrary data pattern may be training data. Based on the command address signal CA, the mode register set 123 may output the mode register data that is stored in a location that corresponds to the command address signal CA within the mode register set 123. The mode register set 123 may be coupled to the data transmission line 124. The mode register set 123 may output the mode register data and/or the arbitrary data pattern to the data transmission line 124.

The memory apparatus 120 may perform a training operation together with the memory controller 110 through the mode register set 123. The training operation may be an operation for setting various parameters for the memory controller 110 and the memory apparatus 120 to perform smooth data communication before the semiconductor system 100 performs a normal operation. During the training operation, the memory controller 110 may control the memory apparatus 120 to store particular data therein or may set a pattern of training data that the memory apparatus 120 internally generates. The memory apparatus 120 may output the particular data or the training data to the memory controller 110. For the training operation, the memory controller 110 may provide the memory apparatus 120 with a first command address signal MRW1, a second command address signal MRR, and a third command address signal MRW2. The first to third command address signals MRW1, MRR, and MRW2 may be command address signals with different combinations from one another. The first command address signal MRW1 may be the command address signal CA where logic values of the plurality of bits have a first combination. The second command address signal MRR may be the command address signal CA where logic values of the plurality of bits have a second combination that is different from the first combination. The third command address signal MRW2 may be the command address signal CA where logic values of the plurality of bits have a third combination that is different from both of the first combination and the second combination. The first command address signal MRW1 may include information regarding controlling the memory apparatus 120 to perform a burst read operation. The second command address signal MRR may include information regarding controlling the memory apparatus 120 to perform a mode register read operation. The third command address signal MRW2 may include information regarding controlling the memory apparatus 120 to perform a mode register write operation. The training operation may be performed by the memory controller 110 that performs the burst read operation of the memory apparatus 120 and then terminates the burst read operation of the memory apparatus 120.

The memory apparatus 120 may perform the burst read operation. The burst read operation may be performed such that the memory apparatus 120 performs the mode register read operation internally, repeatedly, and periodically even though the memory controller 110 does not continuously provide the command address signal CA to the memory apparatus 120. The memory controller 110 may provide the first command address signal MRW1 and the second command address signal MRR sequentially to the memory apparatus 120 in order for the memory apparatus 120 to perform the burst read operation. When the memory apparatus 120 receives the first command address signal MRW1 from the memory controller 110, the mode register set 123 may be set to be ready for the burst read operation. When the memory apparatus 120 receives the second command address signal MRR from the memory controller 110 after the memory apparatus 120 is completely ready for the burst read operation, the mode register set 123 may periodically generate a signal that is related to the mode register read operation to control the memory apparatus 120 to periodically perform the mode register read operation. The memory apparatus 120 may periodically perform the mode register read operation and may periodically provide the training data to the memory controller 110.

In order to terminate the burst read operation of the memory apparatus 120, the memory controller 110 may provide the memory apparatus 120 with the third command address signal MRW2. The memory controller 110 may terminate the burst read operation of the memory apparatus 120 at an arbitrary point in time. In a general semiconductor system, defined is a time interval from when a single command address signal is provided until a subsequent command address signal is provided. However, since the memory apparatus 120 periodically performs a read operation without receiving the command address signal CA from the memory controller 110 during the burst read operation, a violation of the defined time interval may occur when the memory controller 110 terminates the burst read operation of the memory apparatus 120. That is, the command address signal CA may be provided from the memory controller 110 to the memory apparatus 120 before the memory apparatus 120 completes the internal read operation. Therefore, the memory controller 110 may terminate the burst read operation of the memory apparatus 120 by providing the third command address signal MRW2 twice, sequentially, to the memory apparatus 120. The mode register set 123 may terminate the burst read operation, which is being performed by the memory apparatus 120, when the memory apparatus 120 receives the third command address signal MRW2 from the memory controller 110 while the memory apparatus 120 is performing the burst read operation. When the memory apparatus 120 receives the third command address signal MRW2, the mode register set 123 may initialize at least one internal circuit that is performing the burst read operation. For example, the internal circuit may be the data I/O circuit 122. When the memory apparatus 120 receives the third command address signal MRW2, the mode register set 123 may generate a reset signal MRWRST to initialize the at least one internal circuit. In an embodiment, the mode register set 123 may enable the reset signal MRWRST, which has a predetermined pulse width, each time the third command address signal MRW2 is received. In an embodiment, in order to secure a sufficient amount of time for the initialization of the at least one internal circuit, the mode register set 123 may continuously initialize the at least one internal circuit at least during a time period from when the third command address signal MRW2 is first received until the third command address signal MRW2 is secondly received. For example, the mode register set 123 may enable the reset signal MRWRST based on the first received third command address signal MRW2 and may disable the reset signal MRWRST based on the secondly received third command address signal MRW2. By maintaining the reset signal MRWRST in an enabled state during a sufficient amount of time, the mode register set 123 may completely initialize the data I/O circuit 122 and may prevent invalid data from being output from the memory apparatus 120 to the memory controller 110.

Figure 2:
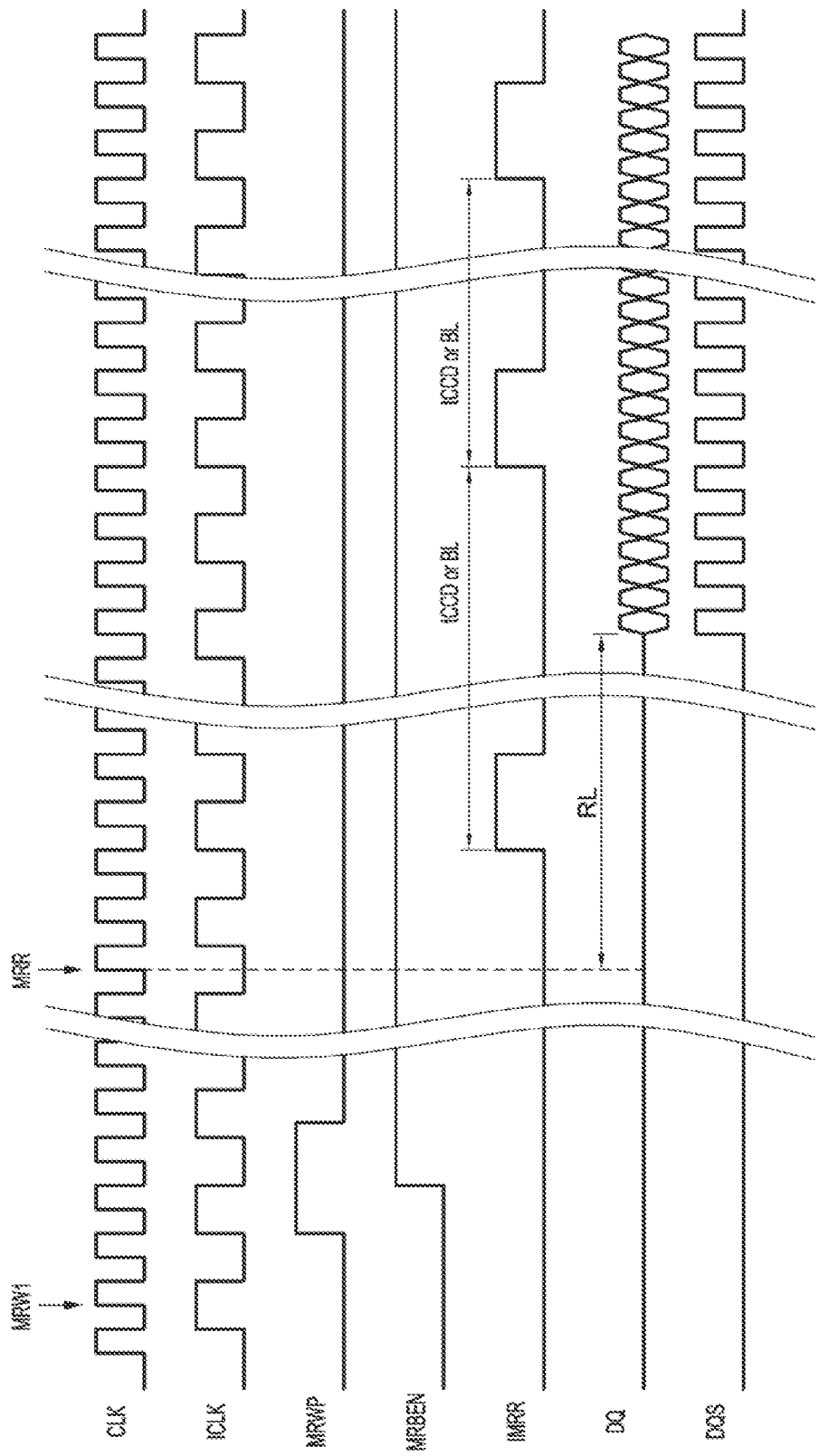
FIG. 2 is a diagram illustrating an operation of a semiconductor system in accordance with an embodiment.

FIG. 2 is a diagram illustrating an operation of the semiconductor system 100 in accordance with an embodiment. FIG. 2 illustrates the memory apparatus 120 that sequentially receives the first command address signal MRW1 and the second command address signal MRR and performs the burst read operation. Referring to FIGS. 1 and 2, the first command address signal MRW1 and the second command address signal MRR may be provided to the memory apparatus 120 in synchronization with the system clock signal CLK. The memory apparatus 120 may divide the system clock signal CLK to generate an internal clock signal ICLK. The period of the internal clock signal ICLK may be two times the period of the system clock signal CLK. When the memory apparatus 120 receives the first command address signal MRW1 from the memory controller 110, the memory apparatus 120 may generate an internal write pulse MRWP in synchronization with the internal clock signal ICLK, and the mode register set 123 may enable a burst read enable signal MRBEN. The burst read enable signal MRBEN may be a signal for the memory apparatus 120 to perform the burst read operation. Detailed description on the burst read enable signal MRBEN will follow. When the memory apparatus 120 receives the second command address signal MRR from the memory controller 110, the memory apparatus 120 may generate an internal read signal IMRR based on the second command address signal MRR. The memory apparatus 120 may perform the mode register read operation based on the internal read signal IMRR. The memory apparatus 120 may perform the mode register read operation to provide the memory controller 110 with the training data as the data DQ. The mode register set 123 may periodically generate the internal read signal IMRR while the burst read enable signal MRBEN is enabled. The period in which the internal read signal IMRR is generated may be a time period that corresponds at least to 'tCCD'. 'tCCD' may be defined as a time interval from when a column command is received until a subsequent column command is received. The period in which the internal read signal IMRR is generated may be a time period that corresponds at least to the burst length (BL). Based on the internal read signal IMRR, the mode register set 123 may provide the data I/O circuit 122 with the training data through the data transmission line 124. Based on the training data, the data I/O circuit 122 may output the data DQ to the data bus 104. When a time period that corresponds to the read latency (RL) elapses after the second command address signal MRR is received, the data I/O circuit 122 of the memory apparatus 120 may provide the memory controller 110 with the training data, which is output from the mode register set 123, as the data DQ. The data I/O circuit 122 of the memory apparatus 120 may also output, through the data strobe bus 105, the data strobe signal DQS that is in synchronization with the data DQ. During the burst read operation, the internal read signal IMRR may be periodically generated by the mode register set 123, and therefore, the memory apparatus 120 may continuously output the data DQ and the data strobe signal DQS.

Figure 3:
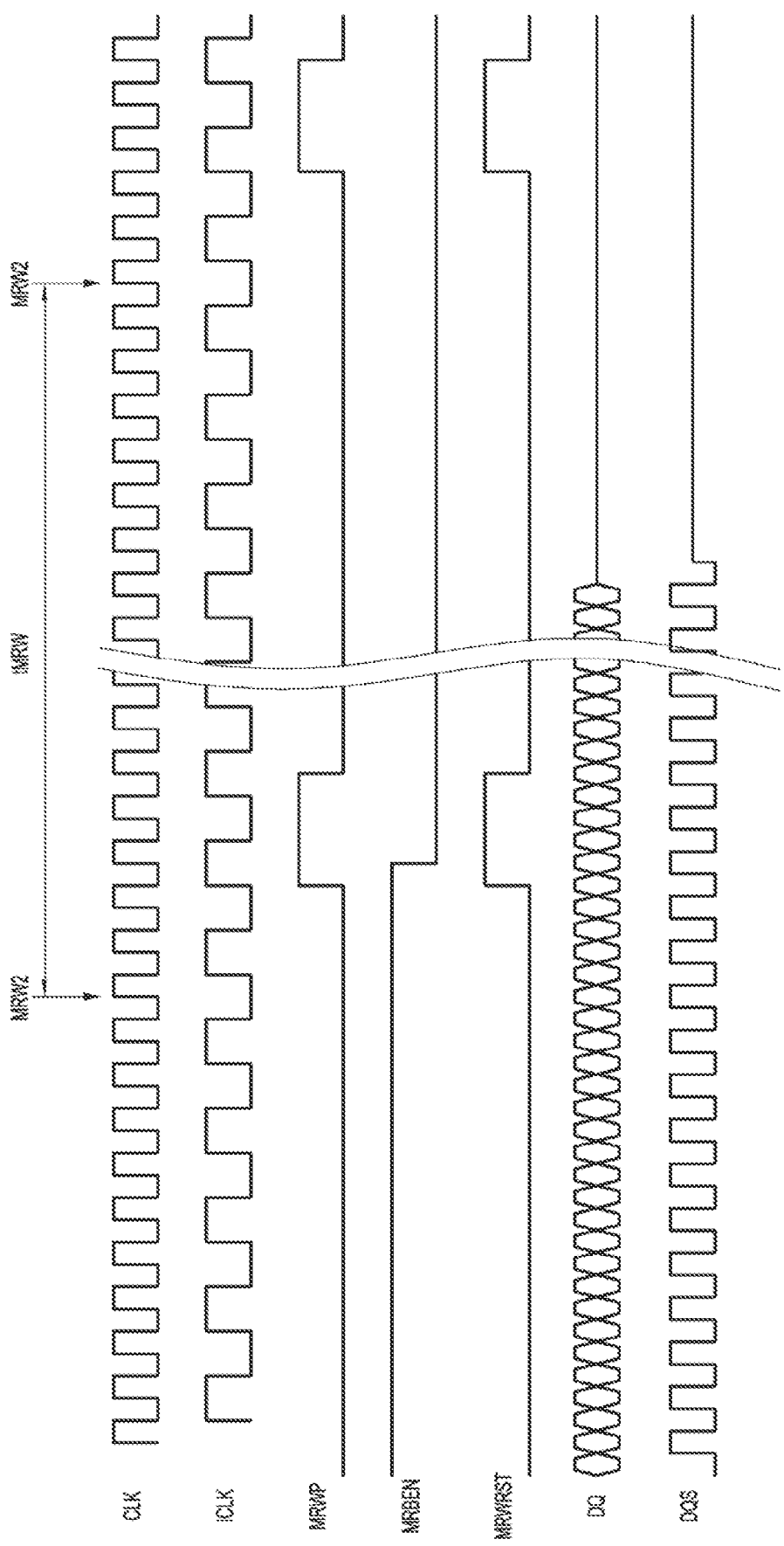
FIG. 3 is a diagram illustrating an operation of a semiconductor system in accordance with an embodiment.

FIG. 3 is a diagram illustrating an operation of the semiconductor system 100 in accordance with an embodiment. FIG. 3 illustrates the memory apparatus 120 that receives the third command address signal MRW2 during the burst read operation and terminates the burst read operation. Referring to FIG. 3, the burst read enable signal MRBEN may stay enabled and the memory apparatus 120 may keep performing the burst read operation. When the memory apparatus 120 receives the third command address signal MRW2 from the memory controller 110, the memory apparatus 120 may generate the internal write pulse MRWP. The memory apparatus 120 may disable the burst read enable signal MRBEN based on the internal write pulse MRWP. Therefore, the burst read operation that the memory apparatus 120 is performing may be terminated. The mode register set 123 may generate the reset signal MRWRST with a pulse width that corresponds to the pulse width of the internal write pulse MRWP. The internal circuit that is performing the burst read operation may be initialized when the reset signal MRWRST is enabled. When a time period that corresponds to 'tMRW' elapses after the third command address signal MRW2 is first provided, the third command address signal MRW2 may be secondly provided from the memory controller 110 to the memory apparatus 120. 'tMRW' may be defined as a time interval from when any command address signal is provided from the memory controller 110 to the memory apparatus 120 until the first command address signal MRW1 and/or the third command address signal MRW2 can be provided. The memory apparatus 120 may generate the internal write pulse MRWP based on the third command address signal MRW2. The mode register set 123 may generate again the reset signal MRWRST based on the internal write pulse MRWP. When the reset signal MRWRST is enabled again, the internal circuit that is performing the burst read operation may be initialized again. When the reset signal MRWRST is enabled, the data I/O circuit 122 may be initialized and the data I/O circuit 122 of the memory apparatus 120 may stop outputting the data DQ and the data strobe signal DQS.

Figure 4:
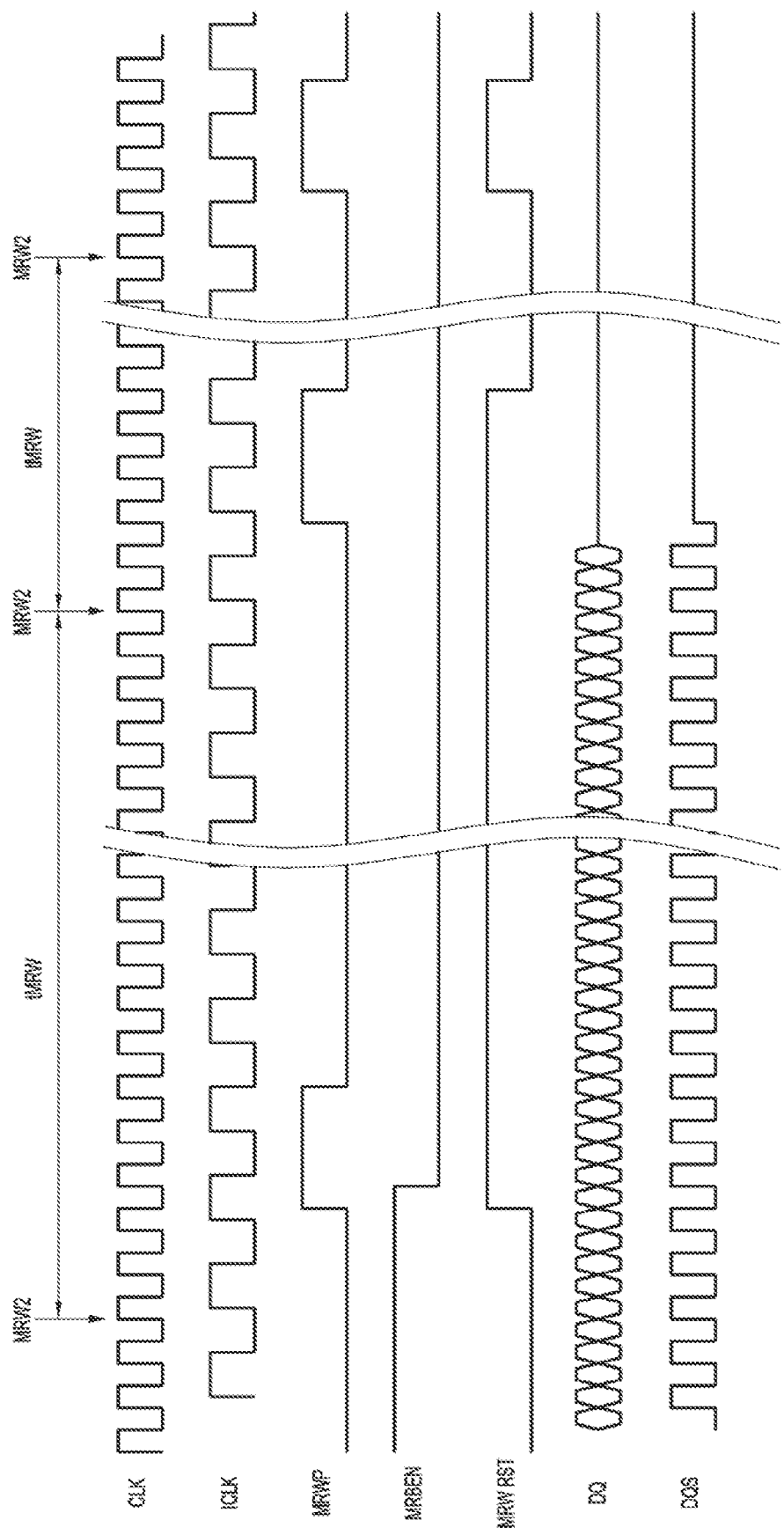
FIG. 4 is a diagram illustrating an operation of a semiconductor system in accordance with an embodiment.

FIG. 4 is a diagram illustrating an operation of the semiconductor system 100 in accordance with an embodiment. FIG. 4 illustrates the memory apparatus 120 that receives the third command address signal MRW2 during the burst read operation and terminates the burst read operation. When the memory apparatus 120 receives the third command address signal MRW2 from the memory controller 110 while performing the burst read operation, the memory apparatus 120 may generate the internal write pulse MRWP. The memory apparatus 120 may disable the burst read enable signal MRBEN based on the internal write pulse MRWP. When the internal write pulse MRWP is enabled, the mode register set 123 may enable the reset signal MRWRST and may maintain the reset signal MRWRST in an enabled state. After the time period that corresponds to 'tMRW' elapses, the third command address signal MRW2 may be secondly provided from the memory controller 110 to the memory apparatus 120. The memory apparatus 120 may generate the internal write pulse MRWP based on the third command address signal MRW2. The mode register set 123 may disable the reset signal MRWRST when the internal write pulse MRWP is disabled. The mode register set 123 may maintain the reset signal MRWRST in an enabled state during a time period from when the internal write pulse MRWP, generated from the first received third command address signal MRW2, is enabled until the internal write pulse MRWP generated from the secondly received third command address signal MRW2 is disabled. Therefore, the mode register set 123 may secure a sufficient amount of time for completely initializing the internal circuit. The data I/O circuit 122 of the memory apparatus 120 may be initialized and may interrupt the outputting of the data DQ and the data strobe signal DQS.

After another time period that corresponds to 'tMRW' elapses, the third command address signal MRW2 may be provided from the memory controller 110 to the memory apparatus 120 again. The memory apparatus 120 may generate the internal write pulse MRWP based on the third command address signal MRW2. The mode register set 123 may generate the reset signal MRWRST based on the internal write pulse MRWP. Since the burst read enable signal MRBEN stays disabled, the mode register set 123 may generate the reset signal MRWRST with the pulse width that corresponds to the pulse width of the internal write pulse MRWP. Before the third command address signal MRW2 is received, the memory apparatus 120 may be relatively stable without performing the burst read operation and may sufficiently initialize the internal circuit even when the reset signal MRWRST is enabled as long as the pulse width that corresponds to the pulse width of the internal write pulse MRWP.

Figure 5:
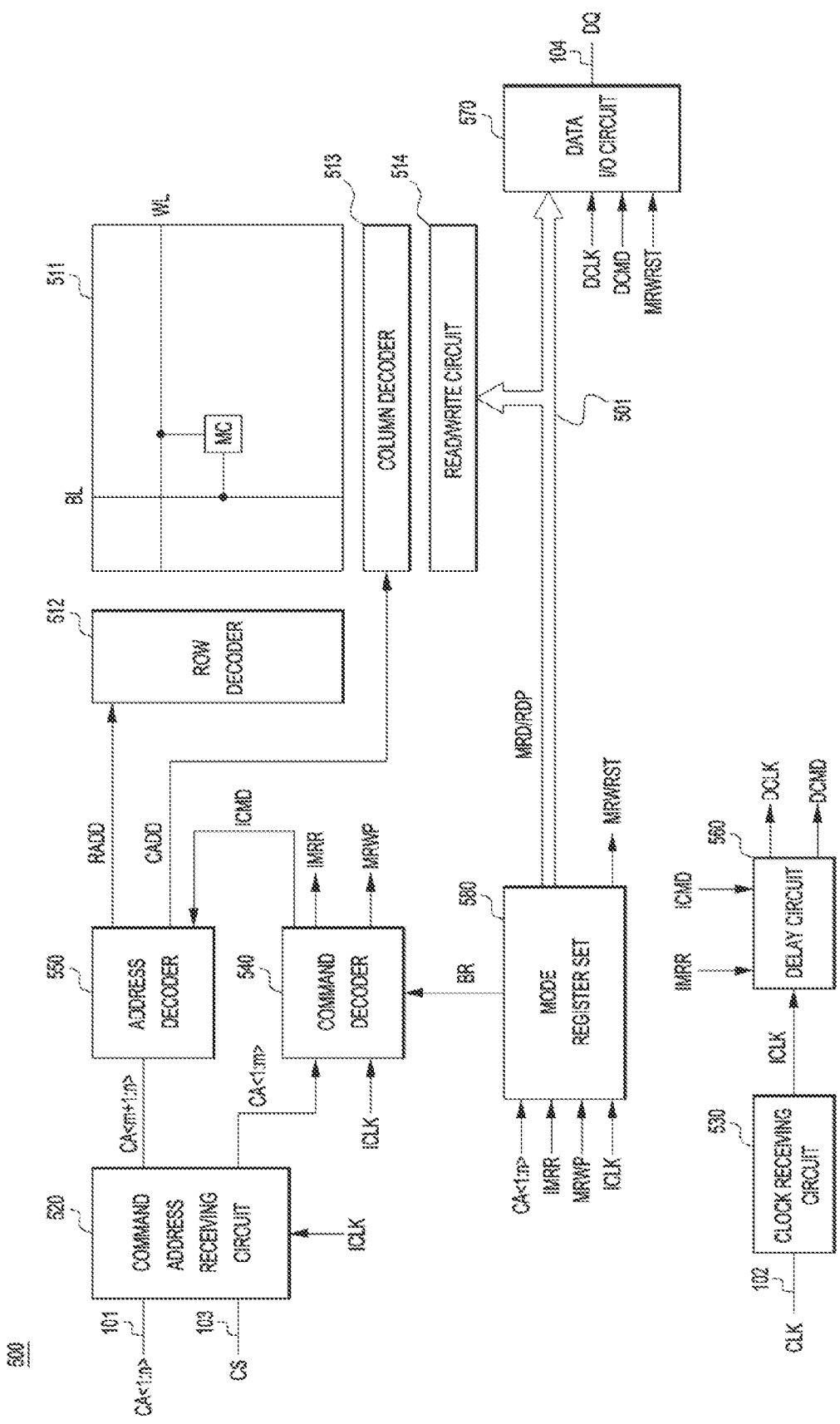
FIG. 5 is a diagram illustrating a configuration of a memory apparatus in accordance with an embodiment.

FIG. 5 is a diagram illustrating a configuration of a memory apparatus 500 in accordance with an embodiment. The memory apparatus 500 may be applied as the memory apparatus 120 illustrated in FIG. 1. The memory apparatus 500 may include a memory cell array 511, a row decoder 512, a column decoder 513, a read/write circuit 514, a command address receiving circuit 520, a clock receiving circuit 530, a command decoder 540, an address decoder 550, a delay circuit 560, a data input/output (I/O) circuit 570, and a mode register set 580. Within the memory cell array 511, a plurality of word lines WL may be disposed in a row direction, and a plurality of bit lines BL may be disposed in a column direction. A plurality of memory cells MC may be coupled to the corresponding word line and bit line at each of cross points between the plurality of word lines WL and the plurality of bit lines BL. When a particular word line and a particular bit line are selected, a memory cell that is coupled to the particular word line and bit line may be accessed. Based on a row address signal RADD, the row decoder 512 may select a particular one among the plurality of word lines WL. The row decoder 512 may decode the row address signal RADD to generate a row select signal and may select a particular word line based on the row select signal. Based on a column address signal CADD, the column decoder 513 may select a particular one among the plurality of bit lines BL. The column decoder 513 may decode the column address signal CADD to generate a column select signal and may select a particular bit line based on the column select signal. The memory cell MC coupled to the particular word line and bit line, which are selected by the row decoder 512 and the column decoder 513, may be coupled to the read/write circuit 514. The read/write circuit 514 may read data that is stored in the memory cell, which is accessed by the row decoder 512 and the read/write circuit 514, and may store data into the accessed memory cell. The read/write circuit 514 may be coupled to the data I/O circuit 570 through a data transmission line 501. During the normal read operation of the memory apparatus 500, the read/write circuit 514 may read data from the accessed memory cell and may provide the read data to the data I/O circuit 570 through the data transmission line 501. During the normal write operation of the memory apparatus 500, the read/write circuit 514 may store, into the accessed memory cell, data that is provided from the data I/O circuit 570 through the data transmission line 501.

The command address receiving circuit 520 may receive a command address signal CA<1:n> and a chip select signal CS, 'n' being an integer equal to or greater than 4. The command address receiving circuit 520 may be coupled to the command address bus 101 and the chip select bus 103, which are illustrated in FIG. 1, and may receive the command address signal CA<1:n> and the chip select signal CS. The command address receiving circuit 520 may determine the command address signal CA<1:n> as valid when receiving the chip select signal CS that is enabled. The command address receiving circuit 520 may latch the command address signal CA<1:n> based on an internal clock signal ICLK and may output the latched command address signal. At least a part of the command address signal CA<1:n> may be utilized to generate an internal command signal. At least a part or a whole of the command address signal CA<1:n> may be utilized to generate an internal address signal. The command address receiving circuit 520 may provide the command decoder 540 with the at least a part of the command address signal CA<1:n> to be utilized to generate an internal command signal. The command address receiving circuit 520 may provide the address decoder 550 with the at least a part of the command address signal CA<1:n> to be utilized to generate an internal address signal. The command address receiving circuit 520 may provide the mode register set 580 with the whole of the command address signal CA<1:n> to be utilized to generate an internal address signal.

The clock receiving circuit 530 may receive a system clock signal CLK. The clock receiving circuit 530 may receive the system clock signal CLK through the clock bus 102 that is illustrated in FIG. 1. The clock receiving circuit 530 may receive the system clock signal CLK to generate the internal clock signal ICLK. When a frequency of the system clock signal CLK is great, the clock receiving circuit 530 may divide the frequency of the system clock signal CLK to generate the internal clock signal ICLK. The clock receiving circuit 530 may divide the system clock signal CLK to generate the internal clock signal ICLK with a greater swing range and a greater pulse width thereby improving an operational timing margin of the memory apparatus 500. For example, the clock receiving circuit 530 may divide the frequency of the system clock signal CLK by half to generate the internal clock signal ICLK with a period that is twice longer than a period of the system clock signal CLK. Although not illustrated, the clock receiving circuit 530 may include a frequency divider configured to divide the frequency of the system clock signal CLK to generate the internal clock signal ICLK. The internal clock signal ICLK may be provided to the command address receiving circuit 520, the command decoder 540, the delay circuit 560, and the mode register set 580.

The command decoder 540 may generate an internal command signal ICMD based on the command address signal CA<1:n> that is received from the command address receiving circuit 520. The command decoder 540 may decode the at least a part of the command address signal CA<1:n> to generate the internal command signal ICMD. For example, the command decoder 540 may decode the first to m-th bits CA<1:m> of the command address signal CA<1:n> to generate the internal command signal ICMD, 'm' being an integer between 1 and 'n'. The bits to be selected and the number of the to-be-selected bits, within the command address signal CA<1:n>, for the command decoder 540 to generate the internal command signal ICMD may vary. The internal command signal ICMD may include various signals. For example, the internal command signal ICMD may include the active signal, the precharge signal, the normal read signal, the normal write signal, the non-target read signal, the non-target write signal, the refresh signal, and so forth. Based on the normal read signal, the read/write circuit 514 and the data I/O circuit 570 may perform the normal read operation of the memory apparatus 500. Based on the normal write signal, the read/write circuit 514 and the data I/O circuit 570 may perform the normal write operation of the memory apparatus 500. When the command address signal CA<1:n> has a combination that corresponds to the first command address signal MRW1 and the third command address signal MRW2, the command decoder 540 may generate the internal write pulse MRWP based on the part CA<1:m> of the command address signal CA<1:n>. When the command address signal CA<1:n> has a combination that corresponds to the second command address signal MRR, the command decoder 540 may generate the internal read signal IMRR based on the part CA<1:m> of the command address signal CA<1:n>. The internal write pulse MRWP and the internal read signal IMRR may be signals that control the operation of the mode register set 580. The command decoder 540 may receive the internal clock signal ICLK. In synchronization with the internal clock signal ICLK, the command decoder 540 may latch at least a part of the command address signal CA<1:n> and may decode the latched signals. In an embodiment, the command decoder 540 may generate the internal read signal IMRR in synchronization with the internal clock signal ICLK. For example, the internal read signal IMRR may have a pulse width that corresponds to a single period of the internal clock signal ICLK. That is, the pulse width of the internal read signal IMRR may correspond to 2tCK when 1tCK is a time period that corresponds to a single period of the system clock signal CLK. In an embodiment, the command decoder 540 may generate the internal write pulse MRWP in synchronization with the internal clock signal ICLK. The pulse width of the internal write pulse MRWP might not be synchronized with the internal clock signal ICLK and may change asynchronously with respect to the internal clock signal ICLK. The pulse width of the internal write pulse MRWP may variously change. For example, the internal write pulse MRWP may have the pulse width that corresponds to a time period between 2tCK and 4tCK.

The address decoder 550 may generate the row address signal RADD and the column address signal CADD based on the internal command signal ICMD and the at least a part of the command address signal CA<1:n> that is received from the command address receiving circuit 520. When the internal command signal ICMD is a row-related command signal, the address decoder 550 may generate the row address signal RADD from the at least a part CA<m+1:n> of the command address signal CA<1:n>. For example, the row-related command signal may include the active signal and the refresh signal. When the internal command signal ICMD is a column-related command signal, the address decoder 550 may generate the column address signal CADD from the at least a part CA<m+1:n> of the command address signal CA<1:n>. For example, the column-related command signal may include the normal read signal and the normal write signal.

The delay circuit 560 may receive the internal clock signal ICLK and the internal command signal ICMD. The delay circuit 560 may perform a delay locking operation on the internal clock signal ICLK to generate a delay clock signal DCLK. In order to delay the internal clock signal ICLK, the delay circuit 560 may include a delay locked loop with a clock delay line. The delay circuit 560 may delay the internal command signal ICMD to generate a delay command signal DCMD. In order to generate the delay command signal DCMD, the delay circuit 560 may include a command delay line. The delay amount of the command delay line and the delay amount of the clock delay line may be set to be substantially the same as each other. The internal command signal ICMD to be provided to the delay circuit 560 may include the normal read signal, the normal write signal, the non-target read signal, and the non-target write signal. The delay circuit 560 may further receive the internal read signal IMRR. The delay circuit 560 may delay the internal read signal IMRR to output the delayed internal read signal IMRR as the delay command signal DCMD. When receiving any of the internal command signal ICMD and the internal read signal IMRR, the delay circuit 560 may delay the received signal to generate the delay command signal DCMD.

The data I/O circuit 570 may be coupled between the data transmission line 501 and the data bus 104. During the normal read operation of the memory apparatus 500, the data I/O circuit 570 may receive data that is provided from the read/write circuit 514 through the data transmission line 501 and may output the received data, as the data DQ, through the data bus 104. The data I/O circuit 570 may include a data transmitter configured to drive the data bus 104 based on the data that is provided through the data transmission line 501. During the normal write operation of the memory apparatus 500, the data I/O circuit 570 may receive the data DQ that is provided through the data bus 104 and may output the received data to the read/write circuit 514 through the data transmission line 501. The data I/O circuit 570 may include a data receiver configured to drive the data transmission line 501 based on the data DQ that is provided through the data bus 104. For example, the data that is transferred through the data transmission line 501 may be parallel data and the data that is transferred through the data bus 104 may be serial data. The data I/O circuit 570 may further include a serializer configured to convert the parallel data into the serial data and a parallelizer configured to convert the serial data into the parallel data.

The data I/O circuit 570 may receive the delay clock signal DCLK, the delay command signal DCMD, and the reset signal MRWRST. The data I/O circuit 570 may receive information regarding latency and an operation mode from the mode register set 580. In synchronization with the delay clock signal DCLK, the data I/O circuit 570 may delay the delay command signal DCMD by a time period that corresponds to the latency and may perform various operations based on the delayed signal. For example, when the delay command signal DCMD is generated based on the normal read signal, the data I/O circuit 570 may output, through the data transmitter, the data as the data DQ to perform the normal read operation, the data being provided from the data transmission line 501. When the delay command signal DCMD is generated based on the normal write signal, the data I/O circuit 570 may set the on-resistance value of the data transmitter and may receive the data DQ through the data receiver to perform the normal write operation. When the delay command signal DCMD is generated based on the non-target read signal and the non-target write signal, the data I/O circuit 570 may set the on-resistance value of the data transmitter without performing the normal read operation or the normal write operation.

When the delay command signal DCMD is generated based on the internal read signal IMRR, the data I/O circuit 570 may perform the mode register read operation of outputting the mode register data MRD and/or the training data RDP, which are output from the mode register set 580. The data I/O circuit 570 may be initialized based on the reset signal MRWRST. When the reset signal MRWRST is enabled, initialized may be all of signals that are generated and processed internally within the data I/O circuit 570. Based on the reset signal MRWRST, the data I/O circuit 570 may initialize signals for setting the on-resistance value of the data transmitter.

The mode register set 580 may receive the internal read signal IMRR, the internal write pulse MRWP, and the command address signal CA<1:n> to generate a burst read signal BR and the reset signal MRWRST. The mode register set 580 may include a register configured to store the mode register data MRD related to various operations of the memory apparatus 500. Based on the internal read signal IMRR and the command address signal CA<1:n>, the mode register set 580 may provide the data I/O circuit 570 with the mode register data MRD about a particular information, among the information that is stored in the register. Based on the internal write pulse MRWP and the command address signal CA<1:n>, the mode register set 580 may select a particular storage space within the register and may store, into the selected storage space, the mode register data MRD that is included in the command address signal CA<1:n>.

When receiving the internal write pulse MRWP and receiving the first command address signal MRW1, the mode register set 580 may set the memory apparatus 500 to perform the burst read operation. Based on the internal write pulse MRWP and the first command address signal MRW1, the mode register set 580 may generate the burst read enable signal MRBEN that is illustrated in FIGS. 2 to 4. When receiving the internal read signal IMRR after the burst read enable signal MRBEN is enabled, the mode register set 580 may periodically generate the burst read signal BR. The burst read signal BR may be provided to the command decoder 540. Even when the second command address signal MRR is not received, the command decoder 540 may periodically enable the internal read signal IMRR based on the burst read signal BR. For example, based on the burst read signal BR, the command decoder 540 may periodically enable the internal read signal IMRR with a time interval that corresponds to at least tCCD or the burst length BL.

When receiving the internal write pulse MRWP and the third command address signal MRW2 while the memory apparatus 500 is performing the burst read operation, the mode register set 580 may terminate the burst read operation and may generate the reset signal MRWRST. Based on the internal write pulse MRWP and the third command address signal MRW2, the mode register set 580 may disable the burst read enable signal MRBEN and may enable the reset signal MRWRST. When receiving the internal write pulse MRWP and the third command address signal MRW2 again, the mode register set 580 may disable the reset signal MRWRST.

Figure 6:
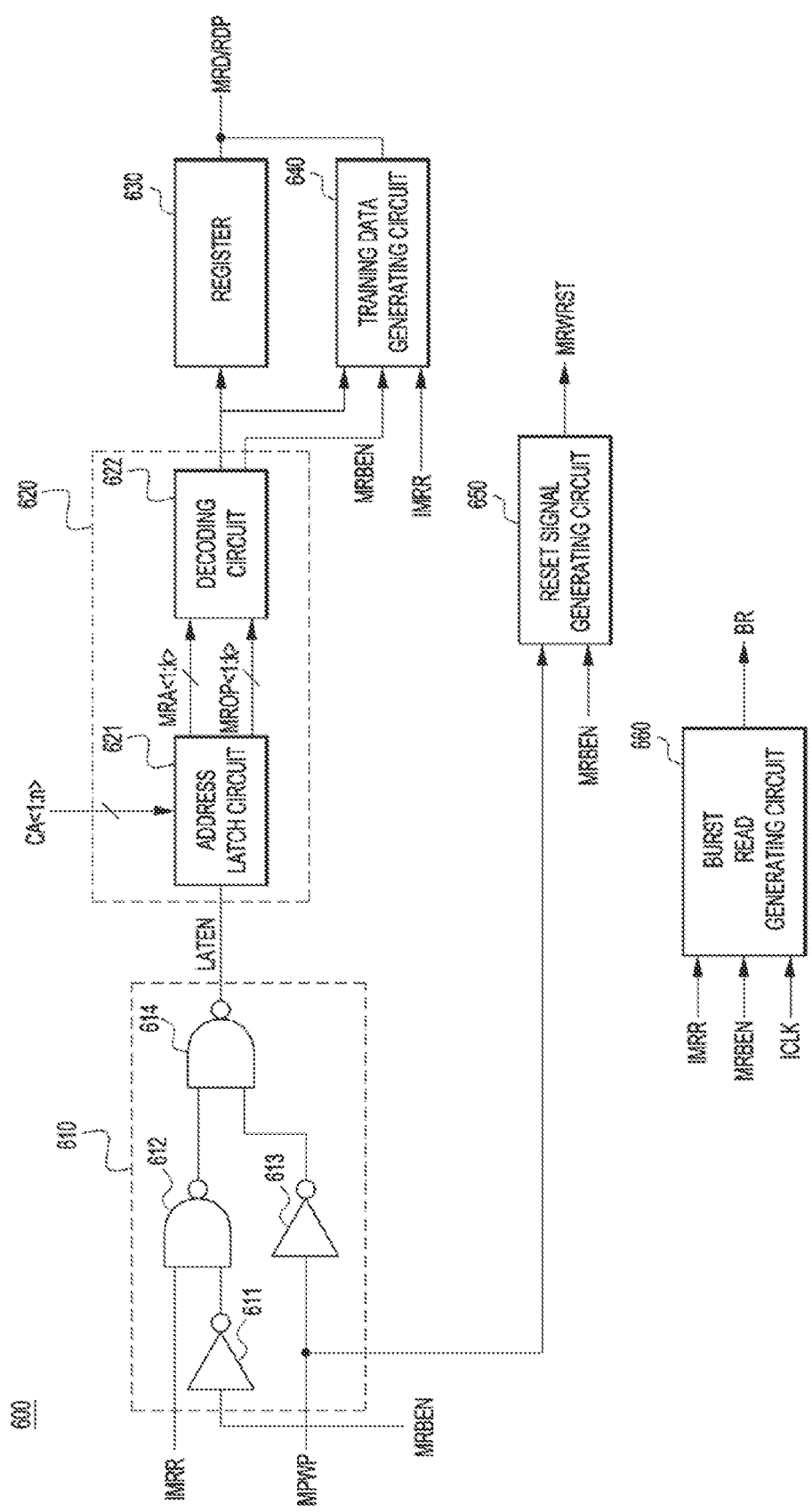
FIG. 6 is a diagram illustrating a configuration of a mode register set in accordance with an embodiment.

FIG. 6 is a diagram illustrating a configuration of a mode register set 600 in accordance with an embodiment. The mode register set 600 may be applied as the mode register set 580 as illustrated in FIG. 5. Referring to FIGS. 5 and 6, the mode register set 600 may include a latch enable control circuit 610, a mode register control circuit 620, a register 630, a training data generating circuit 640, a reset signal generating circuit 650, and a burst read generating circuit 660. The latch enable control circuit 610 may receive the internal read signal IMRR, the internal write pulse MRWP, and the burst read enable signal MRBEN to generate a latch enable signal LATEN. When the burst read enable signal MRBEN stays disabled, the latch enable control circuit 610 may provide, as the latch enable signal LATEN, any one of the internal read signal IMRR and the internal write pulse MRWP to enable the latch enable signal LATEN. When the burst read enable signal MRBEN is enabled, the latch enable control circuit 610 may generate the latch enable signal LATEN not based on the internal read signal IMRR but based only on the internal write pulse MRWP.

The latch enable control circuit 610 may include a first inverter 611, a first NAND gate 612, a second inverter 613, and a second NAND gate 614. The first inverter 611 may receive the burst read enable signal MRBEN to inversely drive the burst read enable signal MRBEN. The first NAND gate 612 may receive the internal read signal IMRR and the output of the first inverter 611. When the burst read enable signal MRBEN is enabled to a logic high level, the first NAND gate 612 may output a signal of a logic high level regardless of the logic level of the internal read signal IMRR. When the burst read enable signal MRBEN is disabled to a logic low level and the internal read signal IMRR is enabled to a logic high level, the first NAND gate 612 may output a signal of a logic low level. The second inverter 613 may receive the internal write pulse MRWP to inversely drive the internal write pulse MRWP. The second NAND gate 614 may receive the outputs of the first NAND gate 612 and the second inverter 613 to output the latch enable signal LATEN. When the first NAND gate 612 outputs the signal of a logic low level or the second inverter 613 outputs the signal of a logic low level (i.e., the internal write pulse MRWP is enabled to a logic high level), the second NAND gate 614 may output the latch enable signal LATEN of a logic high level.

The mode register control circuit 620 may receive the latch enable signal LATEN from the latch enable control circuit 610 and may receive the command address signal CA<1:n> from the command address receiving circuit 520. When the latch enable signal LATEN is enabled, the mode register control circuit 620 may latch the command address signal CA<1:n> and may generate various control signals by decoding the latched command address signal. The various control signals may include a signal that controls operations of the register 630 and the training data generating circuit 640, the mode register data MRD, address information of the register 630 that stores therein or outputs therefrom the mode register data MRD, and the burst read enable signal MRBEN. The register 630 may store therein the mode register data MRD. During the mode register read operation, the register 630 may output, to the data transmission line 501, the mode register data MRD stored in the storage space that corresponds to the address information. During the mode register write operation, the register 630 may store the mode register data MRD into the storage space that corresponds to the address information. The training data generating circuit 640 may receive the burst read enable signal MRBEN and the internal read signal IMRR to generate the training data RDP. Based on the control signal output from the mode register control circuit 620, the training data generating circuit 640 may set a pattern of the training data RDP. Based on the burst read enable signal MRBEN and the internal read signal IMRR, the training data generating circuit 640 may output the training data RDP to the data transmission line 501. While the burst read enable signal MRBEN stays enabled, the training data generating circuit 640 may output, to the data transmission line 501, the training data RDP with the set pattern each time the internal read signal IMRR is enabled.

When receiving the first command address signal MRW1, the mode register control circuit 620 may decode the first command address signal MRW1 to enable the burst read enable signal MRBEN. When receiving the second command address signal MRR while the burst read enable signal MRBEN stays disabled, the mode register control circuit 620 may decode the second command address signal MRR to control the register 630 and may control the register 630 to output, to the data transmission line 501, the mode register data MRD stored therein. When receiving the third command address signal MRW2, the mode register control circuit 620 may decode the third command address signal MRW2 to control the register 630 and may control the register 630 to store therein the mode register data MRD that is included in the third command address signal MRW2.

The mode register control circuit 620 may include an address latch circuit 621 and a decoding circuit 622. When the latch enable signal LATEN is enabled, the address latch circuit 621 may latch the command address signal CA<1:n>. The address latch circuit 621 may output, as a mode register address signal MRA<1:k>, a part of the latched command address signal CA<1:n> and may output, as an operating code MROP<1:k>, remaining part of the latched command address signal CA<1:n>, 'k' being an integer that corresponds to a half of 'n'. The mode register address signal MRA<1:k> and the operating code MROP<1:k> may have different numbers of bits although they are exemplified to have the same number of bits. The mode register address signal MRA<1:k> may include the mode register data MRD and the address information indicating a storage space to store the mode register data MRD in the register 630. The operating code MROP<1:k> may be utilized as a signal for indicating various operations of the mode register set 600. The decoding circuit 622 may decode the mode register address signal MRA<1:k> and the operating code MROP<1:k> to generate various signals that control the operation of the mode register set 600. Based on the operating code MROP<1:k>, the mode register set 600 may store, into the register 630, the mode register data MRD that is generated from the mode register address signal MRA<1:k>. Based on the operating code MROP<1:k>, the mode register set 600 may output, to the data transmission line 501, the mode register data MRD stored in the register 630. Based on the operating code MROP<1:k>, the mode register set 600 may set the pattern of the training data RDP that the training data generating circuit 640 generates. Based on the operating code MROP<1:k>, the mode register set 600 may enable the burst read enable signal MRBEN.

The reset signal generating circuit 650 may receive the internal write pulse MRWP and the burst read enable signal MRBEN to generate the reset signal MRWRST. Based on the internal write pulse MRWP and the burst read enable signal MRBEN, the reset signal generating circuit 650 may generate the reset signal MRWRST. The reset signal generating circuit 650 may provide the internal write pulse MRWP as the reset signal MRWRST and may provide, in synchronization with the internal write pulse MRWP, the burst read enable signal MRBEN as the reset signal MRWRST. After the burst read enable signal MRBEN is enabled, the reset signal generating circuit 650 may maintain the reset signal MRWRST in an enabled state during a time period from when the internal write pulse MRWP that is first generated is enabled until the internal write pulse MRWP that is secondly generated is disabled.

The burst read generating circuit 660 may receive the internal read signal IMRR, the burst read enable signal MRBEN and the internal clock signal ICLK to generate the burst read signal BR. When the burst read enable signal MRBEN is enabled, the burst read generating circuit 660 may generate the burst read signal BR by delaying the internal read signal IMRR by a predetermined amount of time. In synchronization with the internal clock signal ICLK, the burst read generating circuit 660 may delay the internal read signal IMRR. The sum of the predetermined amount of time and the amount of time that is required for the command decoder 540 to generate the internal read signal IMRR based on the burst read signal BR may correspond to 'tCCD' or the burst length BL.

Figure 7:
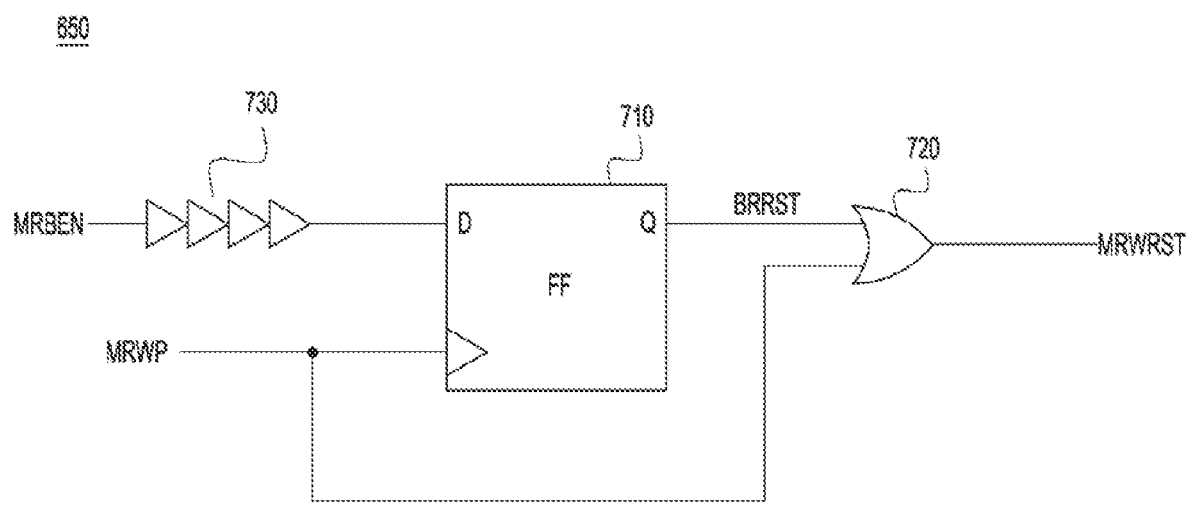
FIG. 7 is a diagram illustrating a configuration of a reset signal generating circuit illustrated in FIG. 6.

FIG. 7 is a diagram illustrating a configuration of the reset signal generating circuit 650 illustrated in FIG. 6. Referring to FIG. 7, the reset signal generating circuit 650 may include a flip-flop 710 and an OR gate 720. The flip-flop 710 may be a D-flip-flop. The flip-flop 710 may receive the burst read enable signal MRBEN through its input node D, may receive the internal write pulse MRWP through its clock node and may output a burst reset signal BRRST through its output node Q. In synchronization with a rising edge of the internal write pulse MRWP, the flip-flop 710 may output the burst read enable signal MRBEN as the burst reset signal BRRST. The OR gate 720 may receive the burst reset signal BRRST and the internal write pulse MRWP. The OR gate 720 may perform an OR gating operation on the burst reset signal BRRST and the internal write pulse MRWP to generate the reset signal MRWRST. When the burst read enable signal MRBEN stays enabled, the reset signal generating circuit 650 may enable the reset signal MRWRST when the internal write pulse MRWP that is first generated is enabled and may disable the reset signal MRWRST when the internal write pulse MRWP that is secondly generated is disabled. In order to secure a timing margin for the flip-flop 710 to sample the burst read enable signal MRBEN, the reset signal generating circuit 650 may further include a delayer 730 configured to delay the burst read enable signal MRBEN. The flip-flop 710 may receive, through its input node D, the signal output from the delayer 730.

Figure 8:
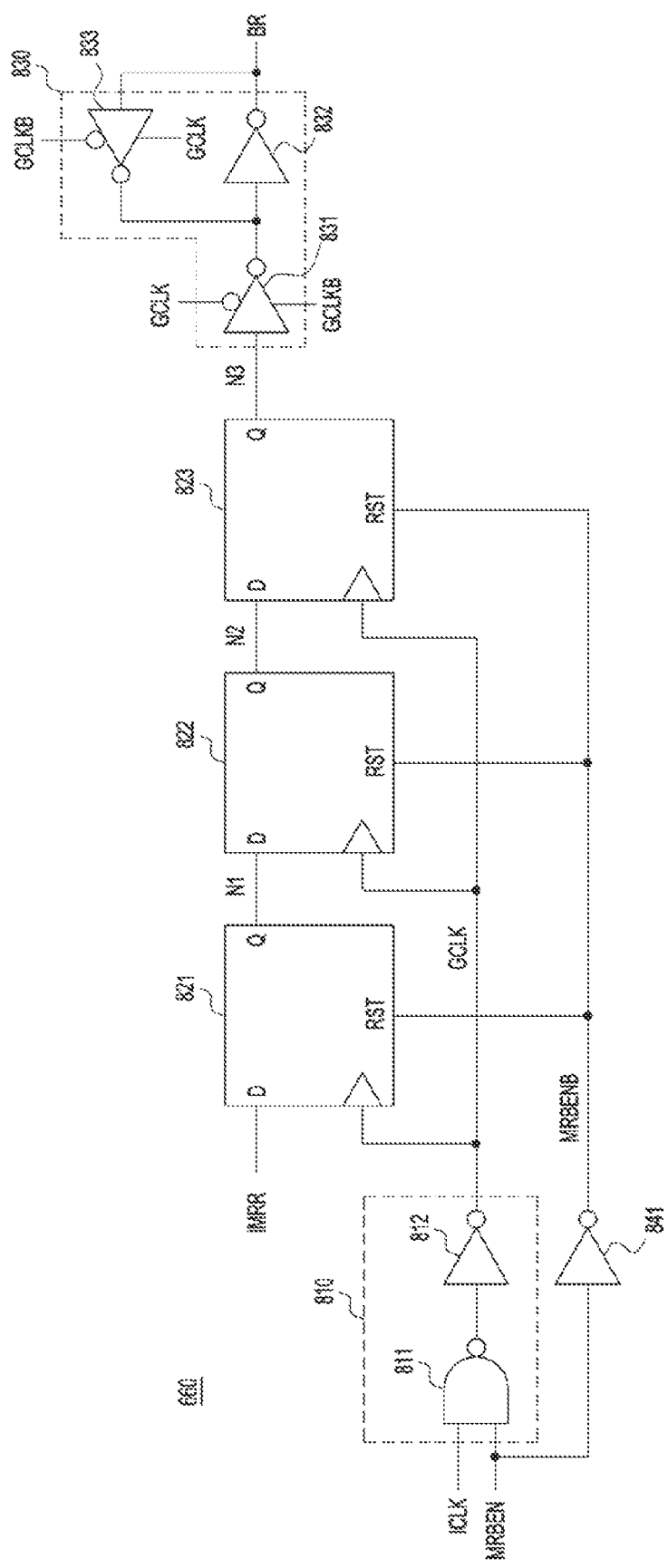
FIG. 8 is a diagram illustrating a configuration of a burst read generating circuit illustrated in FIG. 6.

FIG. 8 is a diagram illustrating a configuration of the burst read generating circuit 660 illustrated in FIG. 6. Referring to FIG. 8, the burst read generating circuit 660 may include a clock gating circuit 810, a plurality of flip-flops and a latch driving circuit 830. The clock gating circuit 810 may receive the internal clock signal ICLK and the burst read enable signal MRBEN. Based on the burst read enable signal MRBEN, the clock gating circuit 810 may perform a gating operation on the internal clock signal ICLK to generate a gated clock signal GCLK. When the burst read enable signal MRBEN is enabled, the clock gating circuit 810 may output the internal clock signal ICLK as the gated clock signal GCLK. When the burst read enable signal MRBEN is disabled, the clock gating circuit 810 may interrupt the outputting of the internal clock signal ICLK as the gated clock signal GCLK.

The clock gating circuit 810 may include a NAND gate 811 and an inverter 812. The NAND gate 811 may receive the internal clock signal ICLK and the burst read enable signal MRBEN. The inverter 812 may inversely drive the signal output from the NAND gate 811 to output the gated clock signal GCLK. When the burst read enable signal MRBEN is enabled, the NAND gate 811 may operate as an inverter and the internal clock signal ICLK may be provided as the gated clock signal GCLK.

In synchronization with the gated clock signal GCLK, the plurality of flip-flops may sequentially delay the internal read signal IMRR. For example, the plurality of flip-flops may include a first flip-flop 821, a second flip-flop 822 and a third flip-flop 823. Each of the first to third flip-flops 821 to 823 may be a D-flip-flop. The first flip-flop 821 may receive the internal read signal IMRR through its input node D and may receive the gated clock signal GCLK through its clock node. The second flip-flop 822 may be coupled to an output node Q of the first flip-flop 821 at its input node D and may receive an output signal N1 of the first flip-flop 821. The second flip-flop 822 may receive the gated clock signal GCLK through its clock node. The third flip-flop 823 may be coupled to an output node Q of the second flip-flop 822 at its input node D and may receive an output signal N2 of the second flip-flop 822. The third flip-flop 823 may receive the gated clock signal GCLK through its clock node. The third flip-flop 823 may output its output signal N3 through its output node Q. Since the gated clock signal GCLK may have a period that corresponds to the internal clock signal ICLK, the output signals N1 to N3 of the first to third flip-flops 821 to 823 may sequentially have a phase difference that corresponds to '2tCK' and a time period, by which the internal read signal IMRR is delayed through the first to third flip-flops 821 to 823, may correspond to '6tCK'. Each of the first to third flip-flops 821 to 823 may receive a complementary signal MRBENB of the burst read enable signal MRBEN through its reset node RST and may be reset based on the complementary signal MRBENB of the burst read enable signal MRBEN. An inverter 841 may inversely drive the burst read enable signal MRBEN to generate the complementary signal MRBENB of the burst read enable signal MRBEN. A number of the plurality of flip-flops may be less or greater than 3 in order to change the period that the internal read signal IMRR is generated based on the burst read signal BR.

The latch driving circuit 830 may drive and latch the signal, which is output from the plurality of flip-flops, to generate the burst read signal BR. Based on the gated clock signal GCLK, the latch driving circuit 830 may perform the driving and latching operation. For example, the latch driving circuit 830 may drive the signal output from the plurality of flip-flops to generate the burst read signal BR while the gated clock signal GCLK has a logic low level and may latch the logic level of the burst read signal BR while the gated clock signal GCLK has a logic high level. Therefore, the amount of time that is required for the latch driving circuit 830 to generate the burst read signal BR by driving and latching the signal output from the plurality of flip-flops may be set to '1tCK'.

The latch driving circuit 830 may include a first control inverter 831, an inverter 832 and a second control inverter 833. The first control inverter 831 may be activated based on the gated clock signal GCLK and a complementary signal GCLKB of the gated clock signal GCLK and may inversely drive the output signal N3 of the third flip-flop 823. The first control inverter 831 may be activated when the gated clock signal GCLK has a logic low level. The inverter 832 may inversely drive a signal, which is output from the first control inverter 831, to generate the burst read signal BR. The second control inverter 833 may be coupled to an output node of the inverter 832 through its input node and may be coupled to an input node of the inverter 832 through its output node. The second control inverter 833 may be activated based on the gated clock signal GCLK and the complementary signal GCLKB of the gated clock signal GCLK. When the gated clock signal GCLK has a logic high level, the second control inverter 833 may be activated and may form, together with the inverter 832, a latch to maintain the logic level of the burst read signal BR.

Figure 9:
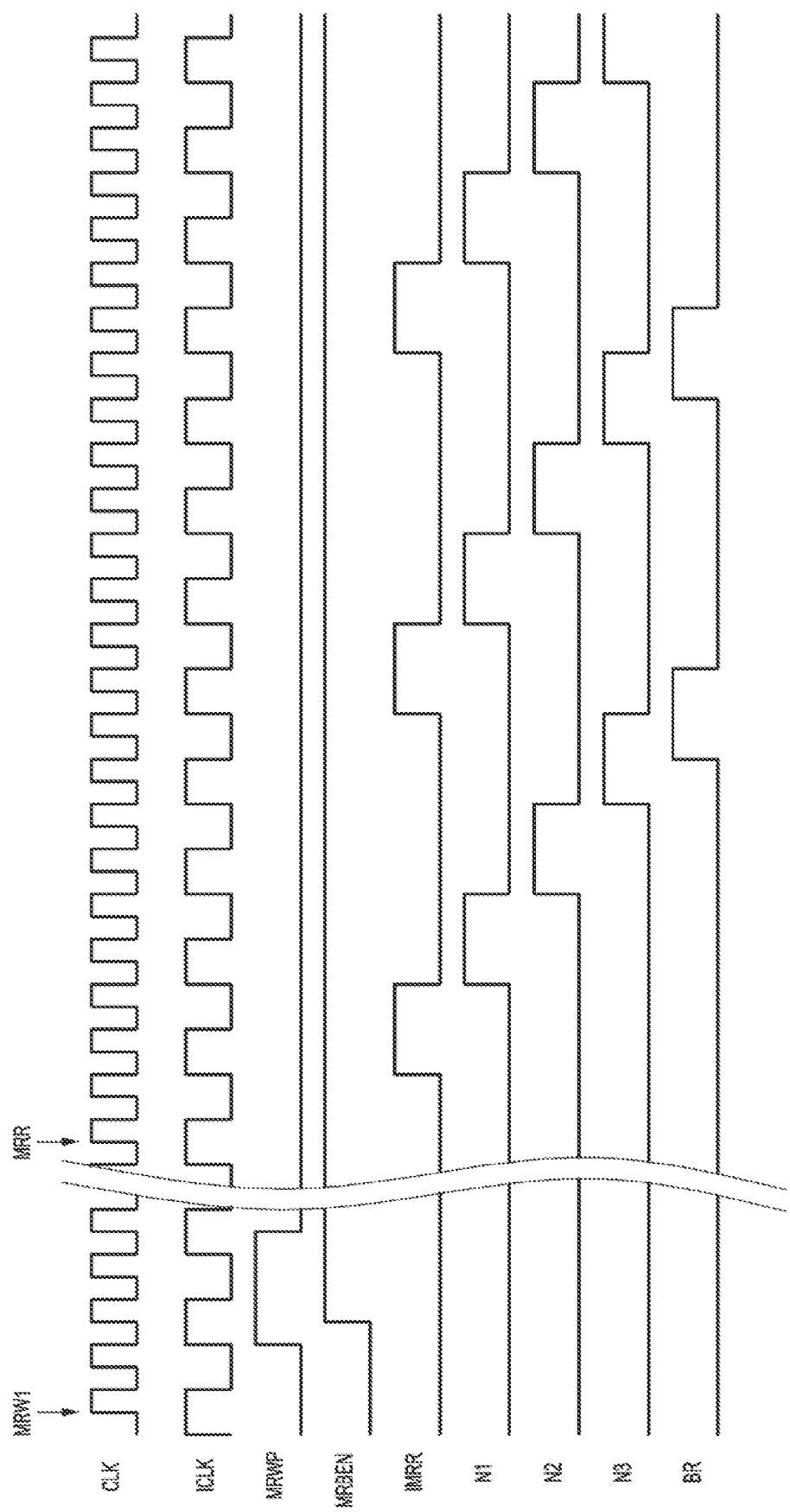
FIG. 9 is a timing diagram illustrating an operation of a mode register set during a burst read operation in accordance with an embodiment.

FIG. 9 is a timing diagram illustrating an operation of the mode register set during the burst read operation in accordance with an embodiment. Referring to FIGS. 1, 5, 6, 8 and 9, when the memory apparatus 120 receives the first command address signal MRW1 from the memory controller 110, the internal write pulse MRWP may be generated and the latch enable signal LATEN may be enabled based on the internal write pulse MRWP. When the latch enable signal LATEN is enabled, the mode register control circuit 620 may enable the burst read enable signal MRBEN based on the first command address signal MRW1. Then, when the memory apparatus 120 receives the second command address signal MRR from the memory controller 110, the internal read signal IMRR may be generated. Since the burst read enable signal MRBEN stays enabled, the latch enable control circuit 610 might not enable the latch enable signal LATEN even when the internal read signal IMRR is generated. The internal read signal IMRR may be provided to the burst read generating circuit 660. The clock gating circuit 810 may provide the internal clock signal ICLK as the gated clock signal GCLK and the internal read signal IMRR may be sequentially delayed by the first to third flip-flops 821 to 823. The output signal N1 of the first flip-flop 821 may be delayed by an amount of the phase that corresponds to '2tCK' when compared with the internal read signal IMRR. The output signal N2 of the second flip-flop 822 may be delayed by an amount of the phase that corresponds to '4tCK' when compared with the internal read signal IMRR. The output signal N3 of the third flip-flop 823 may be delayed by an amount of the phase that corresponds to '6tCK' when compared with the internal read signal IMRR. The latch driving circuit 830 may drive and latch the output signal N3 of the third flip-flop 823 to generate the burst read signal BR. The burst read signal BR may be delayed by an amount of the phase that corresponds to '7tCK' when compared with the internal read signal IMRR. The burst read signal BR may be provided to the command decoder 540. In synchronization with the internal clock signal ICLK, the command decoder 540 may generate the internal read signal IMRR from the burst read signal BR. Therefore, the internal read signal IMRR that is secondly generated may be enabled after a time period of '8tCK' from when the internal read signal IMRR that is first generated is enabled. The internal read signal IMRR may be provided again to the burst read generating circuit 660, which may periodically generate the burst read signal BR after a time period of '7tCK' from when the burst read generating circuit 660 receives the internal read signal IMRR. Therefore, the internal read signal IMRR may be periodically generated with the time interval of '8tCK'.

Figure 10:
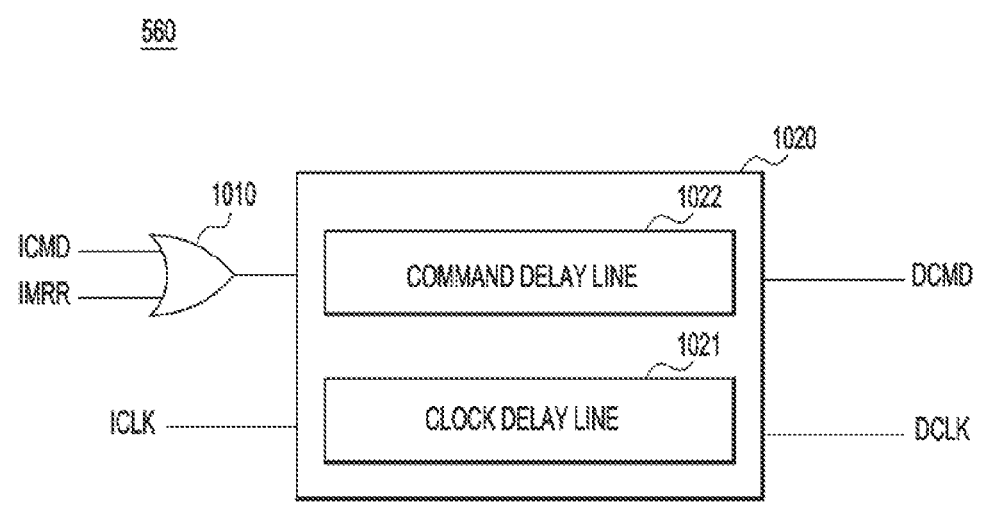
FIG. 10 is a diagram illustrating a configuration of a delay circuit illustrated in FIG. 5.

FIG. 10 is a diagram illustrating a configuration of the delay circuit 560 illustrated in FIG. 5. Referring to FIG. 10, the delay circuit 560 may perform a delay-locking operation on the internal clock signal ICLK. The delay circuit 560 may delay the internal clock signal ICLK to generate the delay clock signal DCLK. The delay circuit 560 may receive the internal command signal ICMD and the internal read signal IMRR. The delay circuit 560 may delay at least one of the internal command signal ICMD and the internal read signal IMRR by a time period as much as the internal clock signal ICLK is delayed, thereby generating the delay command signal DCMD. The delay circuit 560 may include a gating circuit 1010 and a delay-locked loop 1020. The gating circuit 1010 may receive the internal command signal ICMD and the internal read signal IMRR. The gating circuit 1010 may provide the delay-locked loop 1020 with both of the internal command signal ICMD and the internal read signal IMRR. The gating circuit 1010 may include an OR gate. When any one of the internal command signal ICMD and the internal read signal IMRR is enabled, the gating circuit 1010 may provide the enabled signal to the delay-locked loop 1020. The delay-locked loop 1020 may include a clock delay line 1021 and a command delay line 1022. Although not illustrated, the delay-locked loop 1020 may further include various elements configured to perform a delay-locking operation. Through the delay-locking operation on the internal clock signal ICLK, delay amounts of the clock delay line 1021 and the command delay line 1022 may be set to be the same as each other. That is, the delay time of the clock delay line 1021 may be the same as the delay time of the command delay line 1022. The clock delay line 1021 may delay the internal clock signal ICLK to generate the delay clock signal DCLK. The command delay line 1022 may delay the output of the gating circuit 1010 to generate the delay command signal DCMD. The delay circuit 560 may generate the delay command signal DCMD based on the internal command signal ICMD during the normal read operation and the normal write operation of the memory apparatus 500 and, moreover, may generate the delay command signal DCMD based on the internal read signal IMRR during the mode register read operation.

Figure 11:
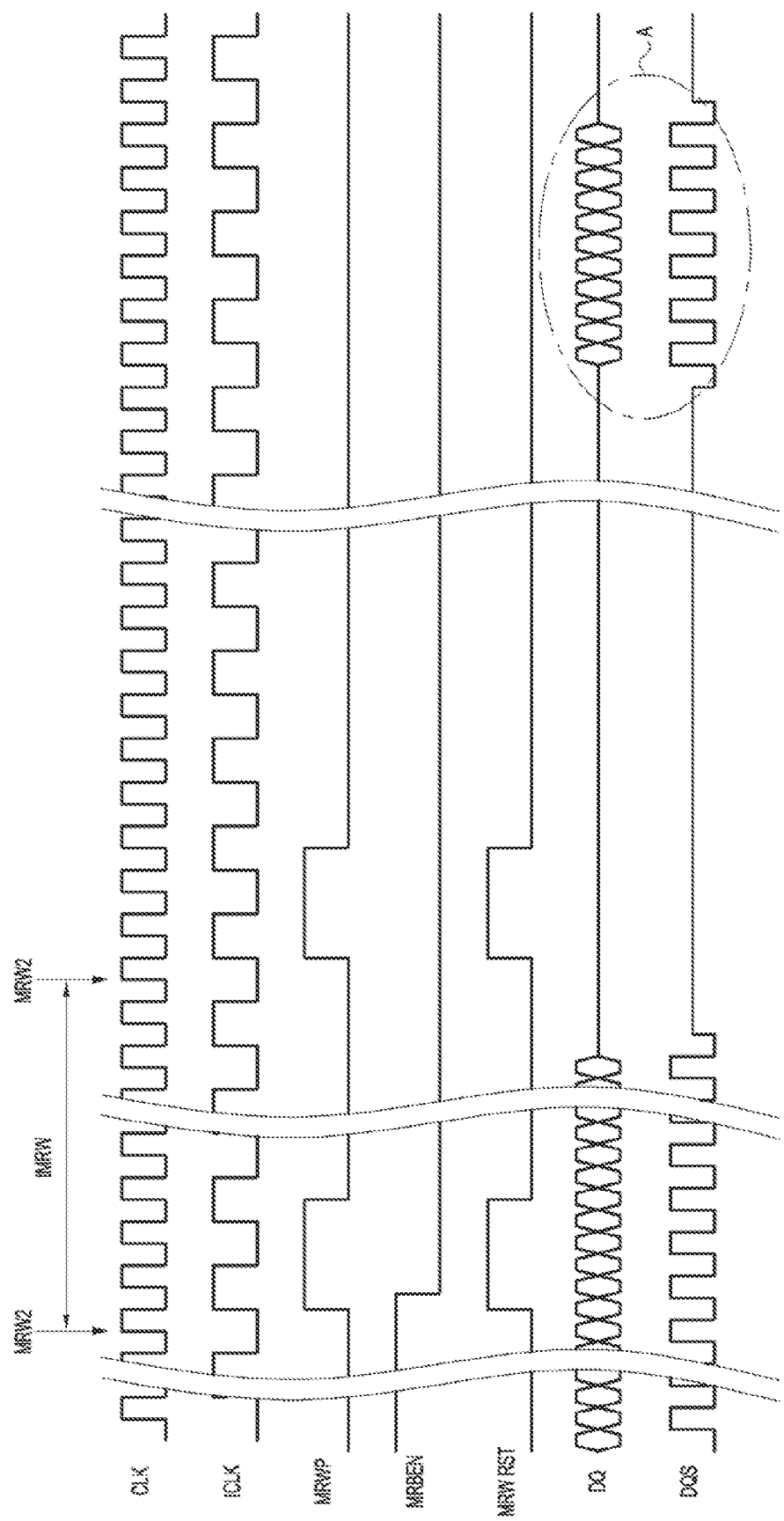
FIG. 11 is a diagram illustrating an operation of a semiconductor system in accordance with an embodiment.
Figure 12:
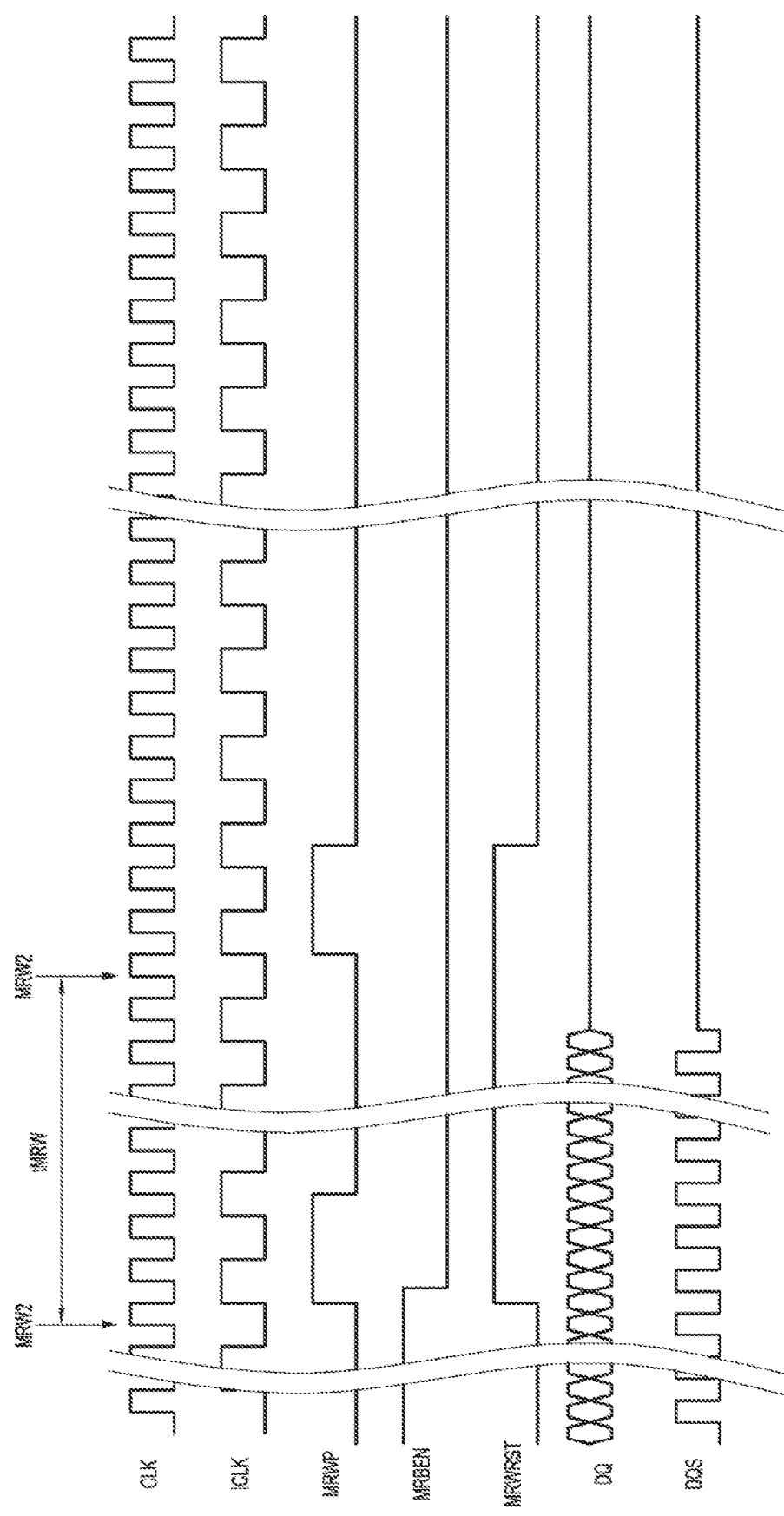
FIG. 12 is a diagram illustrating an operation of a semiconductor system in accordance with an embodiment.

FIGS. 11 and 12 are diagrams illustrating an operation of a semiconductor system in accordance with an embodiment. FIGS. 11 and 12 illustrate the memory apparatus 500 (illustrated in FIG. 5) terminating the burst read operation. FIG. 11 illustrates the operation in a case where the reset signal MRWRST is enabled only when the internal write pulse MRWP is generated, as discussed with reference to FIG. 3. FIG. 12 illustrates the operation in a case where the internal write pulse MRWP stays enabled, as discussed with reference to FIG. 4. Hereinafter, described with reference to FIGS. 1 to 12 will be the operation of the semiconductor system 100 in accordance with an embodiment. Based on the internal read signal IMRR that is periodically generated during the burst read operation, the memory apparatus 120 may output the data DQ and the data strobe signal DQS. In order to terminate the burst read operation that the memory apparatus 120 is performing, the memory controller 110 may provide the memory apparatus 120 with the third command address signal MRW2 sequentially twice. Referring to FIG. 11, based on the third command address signal MRW2 that is first received, the memory apparatus 120 may generate the internal write pulse MRWP. When the internal write pulse MRWP is enabled, the burst read enable signal MRBEN is disabled and the burst read operation may be terminated. Based on the internal write pulse MRWP, the reset signal MRWRST may be enabled with the pulse width that corresponds to the internal write pulse MRWP. Based on the reset signal MRWRST, the internal circuit that is performing the burst read operation may be initialized. When a time period that corresponds to 'tMRW' elapses after the third command address signal MRW2 is first transmitted, the third command address signal MRW2 may be secondly transmitted. The memory apparatus 120 may generate the internal write pulse MRWP based on the third command address signal MRW2 that is secondly received, and the reset signal MRWRST may be again enabled based on the internal write pulse MRWP. Therefore, the internal circuit may be initialized in a time period when the reset signal MRWRST is enabled. However, the sum of the time periods when the reset signal MRWRST is enabled may be around twice the pulse width of the internal write pulse MRWP, which might not be sufficient to completely initialize the internal circuit that continuously outputs the data DQ while performing the burst read operation. When the internal circuit is not completely initialized, invalid data DQ and data strobe signal DQS (as indicated by "A" in FIG. 11) may be provided from the memory apparatus 120 to the memory controller 110 due to an energy remained within the internal circuit although the normal read operation or the normal write operation is not performed. Therefore, a malfunction may occur between the memory controller 110 and the memory apparatus 120.

Referring to FIG. 12, the memory apparatus 120 may maintain the reset signal MRWRST in an enabled state during a time period from when the internal write pulse MRWP generated based on the first received third command address signal MRW2 is enabled until the internal write pulse MRWP generated based on the secondly received third command address signal MRW2 is disabled. When the reset signal MRWRST stays enabled during a sufficient amount of time, the internal circuit may be completely initialized and the invalid data DQ and data strobe signal DQS (as indicated by "A" in FIG. 11) may be prevented from being output.

While certain embodiments have been described above, it will be understood to those skilled in the art that the embodiments described are by way of example only. Accordingly, the memory apparatus, a semiconductor system including the same and an operating method thereof should not be limited based on the described embodiments. Rather, the memory apparatus, a semiconductor system including the same and an operating method thereof described herein should only be limited in light of the claims that follow when taken in conjunction with the above description and accompanying drawings.

What is claimed is:

1. A semiconductor system comprising:
a memory controller configured to provide at least a first command address signal, a second command address signal, and a third command address signal; and
a memory apparatus configured to perform a burst read operation based on the first command address signal and the second command address signal, configured to terminate the burst read operation when the third command address signal is first received while the burst read operation is being performed, and configured to continuously initialize an internal circuit that is performing the burst read operation at least in a time period from when the third command address signal is first received until the third command address signal is secondly received.

2. The semiconductor system of claim 1, wherein the memory apparatus is configured to generate a burst read enable signal based on the first command address signal and configured to periodically generate, when the memory apparatus receives the second command address signal after the burst read enable signal is enabled, an internal read signal based on the second command address signal.

3. The semiconductor system of claim 1, wherein the memory apparatus is configured to enable a reset signal to initialize the internal circuit when the third command address signal is first received and configured to maintain the reset signal in an enabled state at least until the third command address signal is secondly received.

4. A semiconductor system comprising:
a memory apparatus; and
a memory controller configured to sequentially provide a first command address signal and a second command address signal to control the memory apparatus to perform a burst read operation and configured to provide, at least twice, a third command address signal to control the memory apparatus to terminate the burst read operation,
is wherein the memory apparatus is configured to enable a reset signal to initialize an internal circuit that is performing the burst read operation based on the first received third command address signal and configured to disable the reset signal based on the secondly received third command address signal.

5. The semiconductor system of claim 4, wherein the memory apparatus is configured to generate a burst read enable signal based on the first command address signal and configured to periodically generate, when the memory apparatus receives the second command address signal after the burst read enable signal is enabled, an internal read signal based on the second command address signal.

6. The semiconductor system of claim 4, wherein the memory apparatus is configured to maintain the reset signal in an enabled state during a time period from when an internal write pulse generated based on the first received third command address signal is enabled until the internal write pulse that is generated based on the secondly received third command address signal is disabled.

7. An operating method of a semiconductor system, the operating method comprising:
performing, by a memory apparatus, a burst read operation by sequentially receiving a first command address signal and a second command address signal from a memory controller;
terminating, by the memory apparatus, the burst read operation and starting, by the memory apparatus, an operation of initializing an internal circuit that is performing the burst read operation, by receiving a third command address signal from the memory controller; and
terminating, by the memory apparatus, the operation of initializing the internal circuit that is performing the burst read operation by receiving another third command address signal from the memory controller.

8. The operating method of claim 7, wherein the performing of the burst read operation includes:
enabling a burst read enable signal based on the first command address signal; and
periodically and repeatedly enabling an internal read signal after enabling the internal read signal based on the second command address signal.

9. A semiconductor memory apparatus comprising:
a command address receiving circuit configured to receive a command address signal;
a command decoder configured to generate an internal read signal and an internal write pulse based on the command address signal and configured to generate the internal read signal based on a burst read signal;
a delay circuit configured to delay the internal read signal and a clock signal to generate a delay command signal and a delay clock signal;
a data input/output circuit configured to output data based on the delay command signal and the delay clock signal and configured to be initialized based on a reset signal; and a mode register set configured to generate a burst read enable signal based on the command address signal, configured to generate the burst read signal based on the burst read enable signal, and configured to generate the reset signal based on the burst read enable signal and the internal write pulse.

10. The semiconductor memory apparatus of claim 9, wherein the command decoder is configured to periodically generate the internal read signal until the internal write pulse is generated after the burst read signal is enabled.

11. The semiconductor memory apparatus of claim 9,
wherein the command decoder is configured to further generate a normal operation signal based on the command address signal, and
wherein the delay circuit is configured to generate the delay command signal based on at least one of the internal read signal and the normal operation signal.

12. The semiconductor memory apparatus of claim 11, wherein the normal operation signal includes at least one of a read signal, a write signal, a non-target read signal, and a non-target write signal.

13. The semiconductor memory apparatus of claim 9, wherein the data input/output circuit is configured to synchronize timings of the delay command signal and the delay clock signal, configured to generate an output enable signal after a time period that corresponds to latency, and configured to output the data by synchronizing the data to the delay clock signal when the output enable signal is enabled.

14. The semiconductor memory apparatus of claim 9, wherein the mode register set is configured to enable the burst read enable signal when the command address signal has a first combination, configured to enable the reset signal if an internal write pulse is first generated when the burst read enable signal is enabled, and configured to disable the reset signal when the internal write pulse is secondly generated.

15. The semiconductor memory apparatus of claim 9, wherein the mode register set includes:
a latch enable control circuit configured to generate a latch enable signal based on the internal read signal, the internal write pulse, and the burst read enable signal; and
a mode register control circuit configured to decode, based on the latch enable signal, the command address signal to generate a mode register data and the burst read enable signal.

16. The semiconductor memory apparatus of claim 15, wherein the latch enable control circuit is configured to enable the latch enable signal based on any one of the internal read signal and the internal write pulse and configured to maintain, when the burst read enable signal is enable, the latch enable signal in a disabled state.

17. The semiconductor memory apparatus of claim 9, wherein the mode register set includes:
a reset signal generating circuit configured to generate the reset signal based on the internal write pulse and the burst read enable signal; and
a burst read generating circuit configured to generate the burst read signal based on the burst read enable signal and the internal read signal.

18. The semiconductor memory apparatus of claim 17, wherein the reset signal generating circuit is configured to output the internal write pulse as the reset signal and configured to output, in synchronization with the internal write pulse, the burst read enable signal as the reset signal.

19. The semiconductor memory apparatus of claim 17, wherein the reset signal generating circuit includes:
- a flip-flop configured to receive the burst read enable signal through its input node, configured to receive the internal write pulse through its clock node, and configured to output a burst reset signal through its output node; and
- an OR gate configured to perform an OR gating operation on the internal write pulse and the burst reset signal to generate the reset signal.

20. The semiconductor memory apparatus of claim 17, wherein the burst read generating circuit is configured to delay, when the burst read enable signal is enabled, the internal read signal by a predetermined amount of time to generate the burst read signal.

21. The semiconductor memory apparatus of claim 20, wherein a sum of the predetermined amount of time and an amount of time that is required for the command decoder to generate the internal read signal based on the burst read signal is a time period that corresponds to a burst length.

22. The semiconductor memory apparatus of claim 20, wherein the burst read generating circuit includes:
- a clock gating circuit configured to perform a gating operation on the clock signal to generate a gated clock signal based on the burst read enable signal;
- a plurality of flip-flops configured to sequentially delay the internal read signal in synchronization with the gated clock signal; and
- a latch driving circuit configured to drive and latch the delayed internal read signal to generate the burst read signal based on the gated clock signal.

23. A semiconductor system comprising:
- a memory controller configured to provide at least a first command address signal, a second command address signal, and a third command address signal; and
- a memory apparatus configured to perform a burst read operation based on the first command address signal and the second command address signal, configured to terminate the burst read operation when the third command address signal is received twice, and configured to continuously initialize an internal circuit that is performing the burst read operation in a section the third command address signal is received twice.

24. The semiconductor system of claim 23, wherein the memory apparatus is configured to generate a burst read enable signal based on the first command address signal and configured to periodically generate, when the memory apparatus receives the second command address signal after the burst read enable signal is enabled, an internal read signal based on the second command address signal.

25. The semiconductor system of claim 23, wherein the memory apparatus is configured to enable a reset signal to initialize the internal circuit when the third command address signal is first received and configured to maintain the reset signal in an enabled state at least until the third command address signal is secondly received.

* * * * *

UNITED STATES PATENT AND TRADEMARK OFFICE
CERTIFICATE OF CORRECTION

PATENT NO. : 11,372,591 B2
APPLICATION NO. : 17/157516
DATED : June 28, 2022
INVENTOR(S) : Seung Wook Oh et al.

It is certified that error appears in the above-identified patent and that said Letters Patent is hereby corrected as shown below:

In the Claims

In Column 21, Line 10, please replace Claim 4 with the following:
4. A semiconductor system comprising:
a memory apparatus; and
a memory controller configured to sequentially provide a first command address signal and a second command address signal to control the memory apparatus to perform a burst read operation and configured to provide, at least twice, a third command address signal to control the memory apparatus to terminate the burst read operation,
wherein the memory apparatus is configured to enable a reset signal to initialize an internal circuit that is performing the burst read operation based on the first received third command address signal and configured to disable the reset signal based on the secondly received third command address signal.

Signed and Sealed this
Thirtieth Day of August, 2022

Katherine Kelly Vidal
*Director of the United States Patent and Trademark Office*